United States Patent [19]
Ohkubo

[11] Patent Number: 5,504,705
[45] Date of Patent: Apr. 2, 1996

[54] SEMICONDUCTOR MEMORY DEVICE

[75] Inventor: Hiroaki Ohkubo, Tokyo, Japan

[73] Assignee: NEC Corporation, Tokyo, Japan

[21] Appl. No.: 357,338

[22] Filed: Dec. 16, 1994

[30] Foreign Application Priority Data

Dec. 16, 1993 [JP] Japan .................................. 5-317005

[51] Int. Cl.⁶ .................................................. G11C 13/00
[52] U.S. Cl. ............................................ 365/156; 365/72
[58] Field of Search ................................... 365/182, 185, 365/189.01, 230.01, 184

[56] References Cited

U.S. PATENT DOCUMENTS 4,864,374   9/1989   Banerjee .................................. 365/185

*Primary Examiner*—Terrell W. Fears
*Attorney, Agent, or Firm*—Popham, Haik, Schnobrich & Kaufman, Ltd.

[57] ABSTRACT

A contact hole connecting the source region of a LDD construction driver transistor and a grounding wiring layer (Vss) is provided in self-alignment with respect to a gate electrode of a driver transistor. With the source region formed by impurity introduced through the contact hole, the driver transistor is provided with asymmetric source/drain structure. By this, the on current of the LDD construction driver transistor can be improved without increasing the transistor size. Furthermore, imbalance of diffusion layer resistance in the source region can be reduced to improve stability of cell operation.

2 Claims, 8 Drawing Sheets

SEMICONDUCTOR MEMORY DEVICE

BACKGROUND OF THE INVENTION

1. Field of the Invention

The present invention relates generally to a semiconductor memory device. More specifically the invention relates to a semiconductor memory device having memory cells, each constituted of one flip-flop circuit and two switching transistors.

2. Description of the Related Art

Conventionally, as a static random access memory (hereinafter referred to as "SRAM") having memory cells, each constituted of one flip-flop circuit and two switching transistors, one having the following construction has been known.

FIG. 1 shows a circuit diagram of a SRAM cell. The SRAM cell is present at a junction between complementary data lines DL1 and DL2 and one set of word lines WL1 and WL2 and connected to the data lines and the word lines via switching transistors Qt1 and Qt2. Also, source regions of driver transistors Qd1 and Qd2 are connected to a grounding wiring Vss. Source regions of MOS type TFT Qp1 and Qp2 as load elements are connected to a power supply wiring Vcc.

FIG. 2 shows a section of such SRAM cell. In the construction illustrated in FIG. 2, the driver transistors Qd2, with commonly connected to a contact hole Cg2 connecting the source regions and the grounding wiring Vss, and a part of the driver transistor Qd2A and MOS type TFT Qp1 and Qp2 of another SRAM cell adjacent to the illustrated SRAM cell are illustrated.

Next, a fabrication process of the prior art will be discussed, At first, as shown in FIG. 3A, after forming a field oxide layer 2 for element isolation on a P-type silicon substrate 1 by selective oxidation, gate oxide layer 3 is formed on the substrate 1 by thermal oxidation.

Subsequently, the gate oxide layer 3 above regions that will form the drains of the driver transistors Qd1 and Qd2 is selectively removed to form a buried contact hole DC2.

Then, gate electrode 4(Qd2) of a polycrystalline silicon layer doped in N-type is formed. Thereafter, using the gate electrode 4 as mask, ion implantation for phosphorous is performed. By this, N-type low concentration diffusion layer 6, the source and drain regions of the driver transistors Qd1 and Qd2 and the switching transistors Qt1 and Qt2, is formed.

Subsequently, after formation of a spacer 7 formed of a silicon oxide layer on the side surface 4 of the gate electrode 4, ion implantation of arsenic is performed. By this, N-type high concentration diffusion layer 9, which is the source and drain regions of the driver transistors Qd1 and Qd2 and the switching transistors Qt1 and Qt2 is formed. It should be noted that the reference numeral 8d-2 represents a N-type high concentration diffusion layer of the buried contact hole DC2.

Then, as shown in FIG. 3B, after depositing interlayer insulation layer of silicon oxide, using a photoresist layer 18 as a mask, a contact hole Cg2 is formed in the source forming region of the driver transistors Qd1 and Qd2.

Thereafter, in order to suppress increasing of a contact resistance, ion implantation of phosphorous is performed for the surface of the substrate exposed within the contact hole Cg2. By this, N-type high concentration source region 10 is formed as shown in FIG. 3C. Subsequently, with a refractory silicide film 11 connected to the N-type high concentration source region 10, the grounding wiring 11 (Vss) is formed.

Then, as shown in FIG. 2, a silicon oxide layer as an interlayer insulation layer 12 is formed, a contact hole is formed above the gate electrode (such as 4(Qd1) and so forth) of the driver transistor, the gate electrode (13-1 and so forth) of the load element is formed, a TFT gate oxide layer 14 is formed, a TFT channel portion and so forth is formed by providing the contact hole, a BPSG layer 16 is deposited, and the data line 17 (D11) of an aluminum film 17 is formed by forming the contact hole for data line.

In FIG. 2, the contact hole Cg2 for grounding of the driver transistor is placed with offset from the center of the driver transistors Qd2 and Qd2A. This offset is caused by mask alignment for forming the contact hole Cg2. This offset may cause non-uniformity of the source region of the driver transistor. In the example of FIG. 2, the driver transistor Qd2 has the N-type low concentration diffusion region 6 whereas the driver transistor Qd2A does not have the N-type low concentration diffusion layer. Similar matter occurs on another driver transistor Qd1. Accordingly, unbalance in current drive performance is caused between two driver transistors in the same SRAM cell. For stable operation of the SRAM cell, it is essential that the performance ratio (on current ratio) of the driver transistor is higher than that of the switching transistor. Therefore, unbalance in the current driving performance should cause instability in the SRAM cell operation.

The above-mentioned SRAM thus encounters problems in that fluctuation in dimension between the high concentration source region and the gate electrode is easily caused and assuring stable operation is difficult. While such problems may be solved by providing greater interval to the adjacent memory cell, this solution is clearly backward in view of package density.

SUMMARY OF THE INVENTION

It is an object of the present invention to provide a semiconductor memory device which has SRAM capable to operate stably without sacrificing package density.

According to the present invention, a semiconductor memory device including memory cells, each of which has a flip-flop circuit including two inverters, each constituted of a driver transistor and a load element, and input end and output end of one of said inverters being connected to output end and input end of the other inverter, comprises said driver transistor having a gate insulation layer and a gate electrode selectively formed on the surface of a first conductive type semiconductor substrate, an insulative spacer provided on the side surface of said gate electrode, an interlayer insulation layer covering said insulative spacer and said gate electrode, a second conductive type low concentration drain region and a second conductive type high concentration drain region formed on the surface of said semiconductor substrate with self-aligning with said gate electrode and said insulative spacer respectively, a contract hole having a boundary at a portion of said interlayer insulation layer fitted with the side surface of said insulative spacer and extending between said drain region and said gate electrode to reach a region on the semiconductor substrate, a second conductive type source region provided on the semiconductor substrate in self-alignment with the bottom portion of said contact hole, and a grounding wiring connected to said second conductive type source region via said contact hole.

With the present invention, in the semiconductor device having SRAM cell, it becomes possible to provide the contact hole (strictly the bottom thereof) connecting the source region of the driver transistor and the grounding wiring layer in self-alignment with the gate electrode of the driver transistor, and with the impurity introduced through the contact hole, the driver transistor is provided with the asymmetric source/drain structure, to reduce the diffusion resistance in the source region of the driver transistor and whereby permit increasing of the on current without increasing the transistor size to contribute for stabilization of the cell operation. Also, since the source region is formed in self-alignment with the grounding contact hole and the gate electrode, it becomes possible to reduce imbalance of the diffusion layer of the source region between the driver transistors in the cell without causing offset due to alignment. This is effective for maintaining balance of the flip-flop circuit to improve stability of the cell operation and particularly effective for down-sizing of the cell.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DETAILED DESCRIPTION OF THE PREFERRED EMBODIMENTS

The present invention will be discussed hereinafter in detail in terms of the preferred embodiments with reference to FIGS. 4 to 8. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
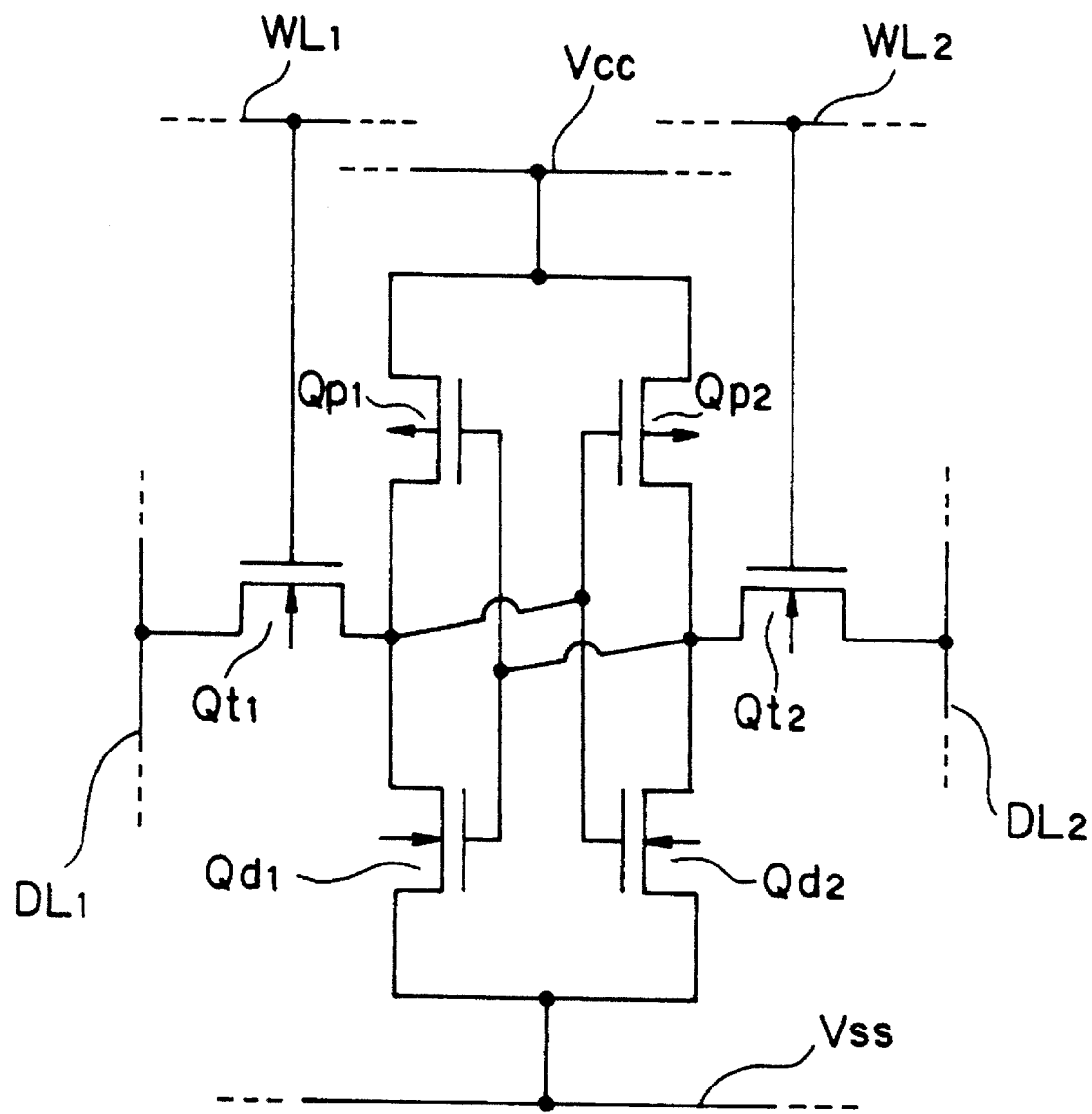
FIG. 1 is a circuit diagram of a SRAM.
Figure 2:
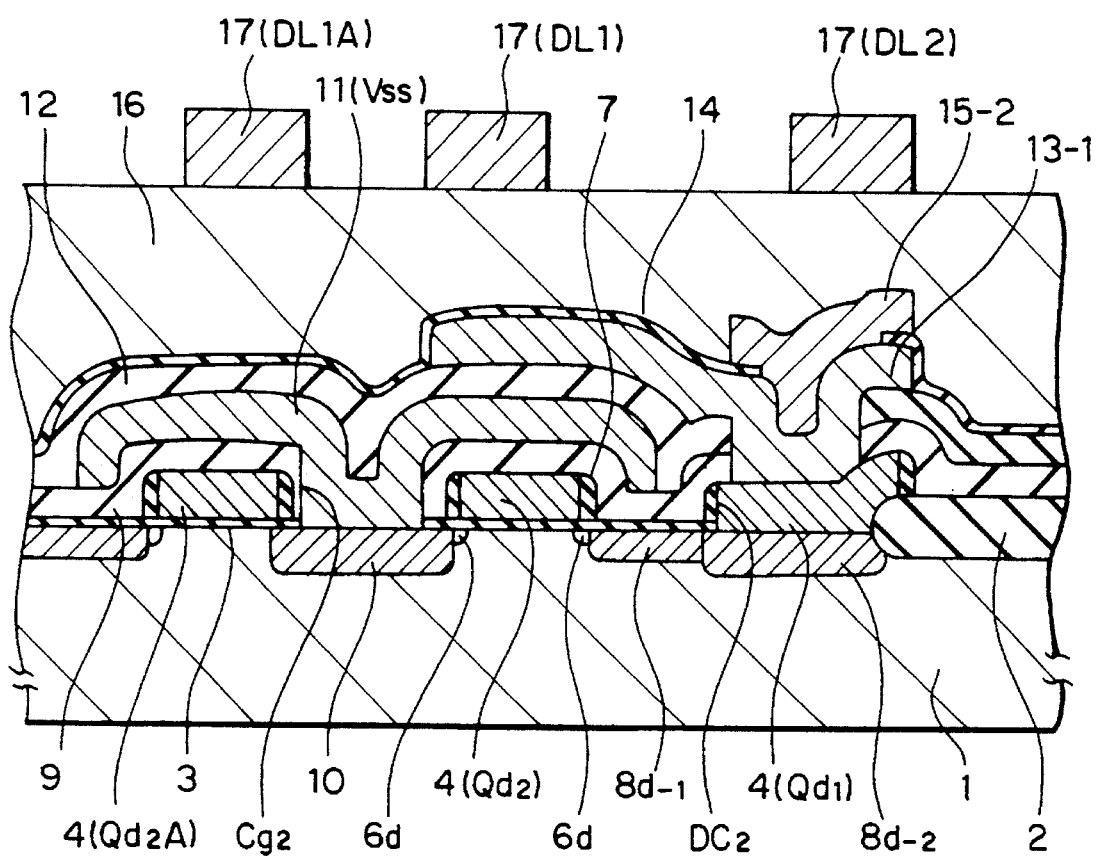
FIG. 2 is a section showing the structure of conventional SRAM.
Figure 3A:
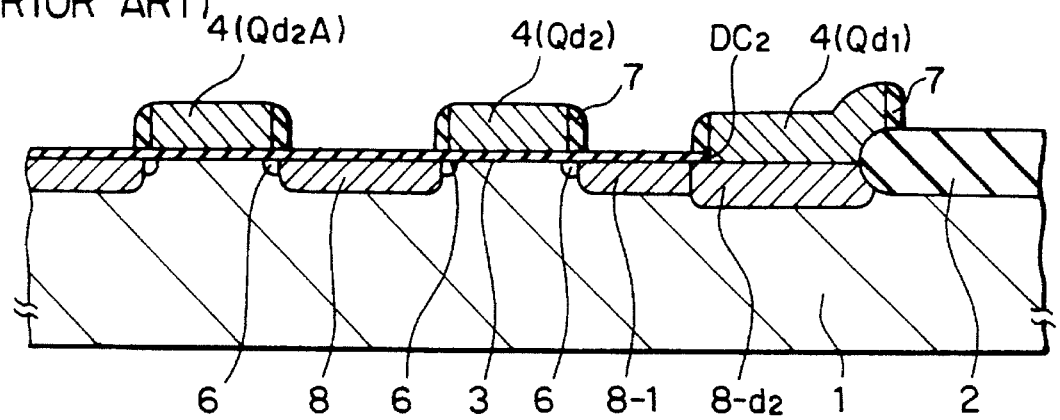
FIGS. 3A to 3C are sections showing the conventional process steps in fabrication of SRAM.
Figure 3B:
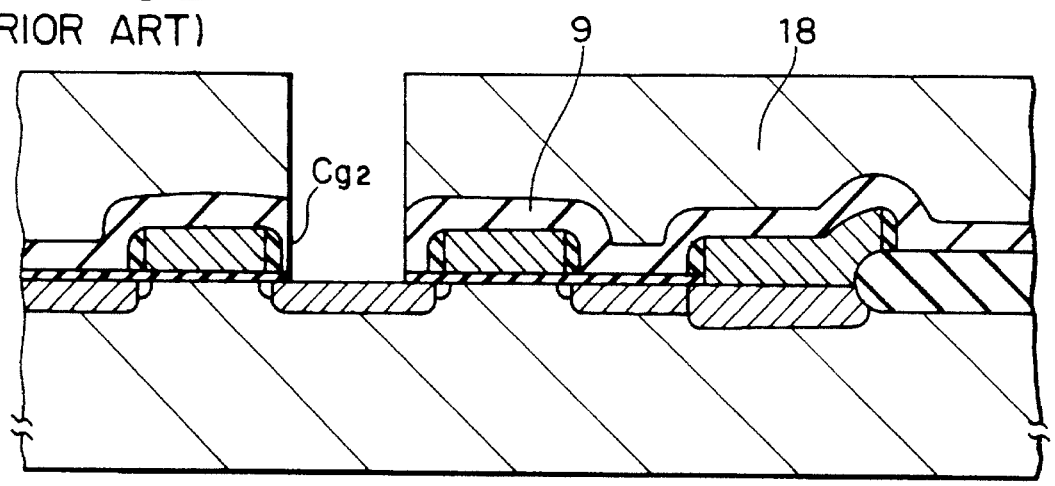
Figure 3C:
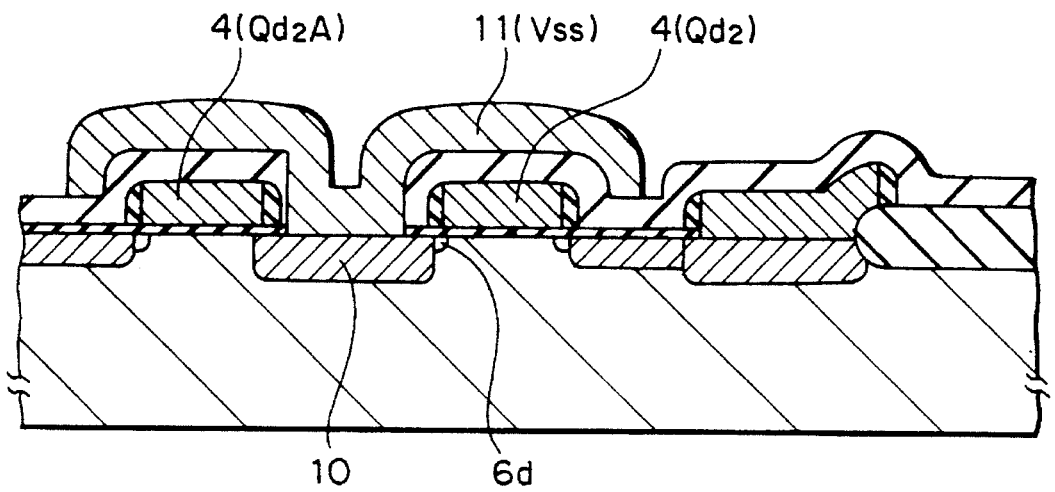
Figure 4:
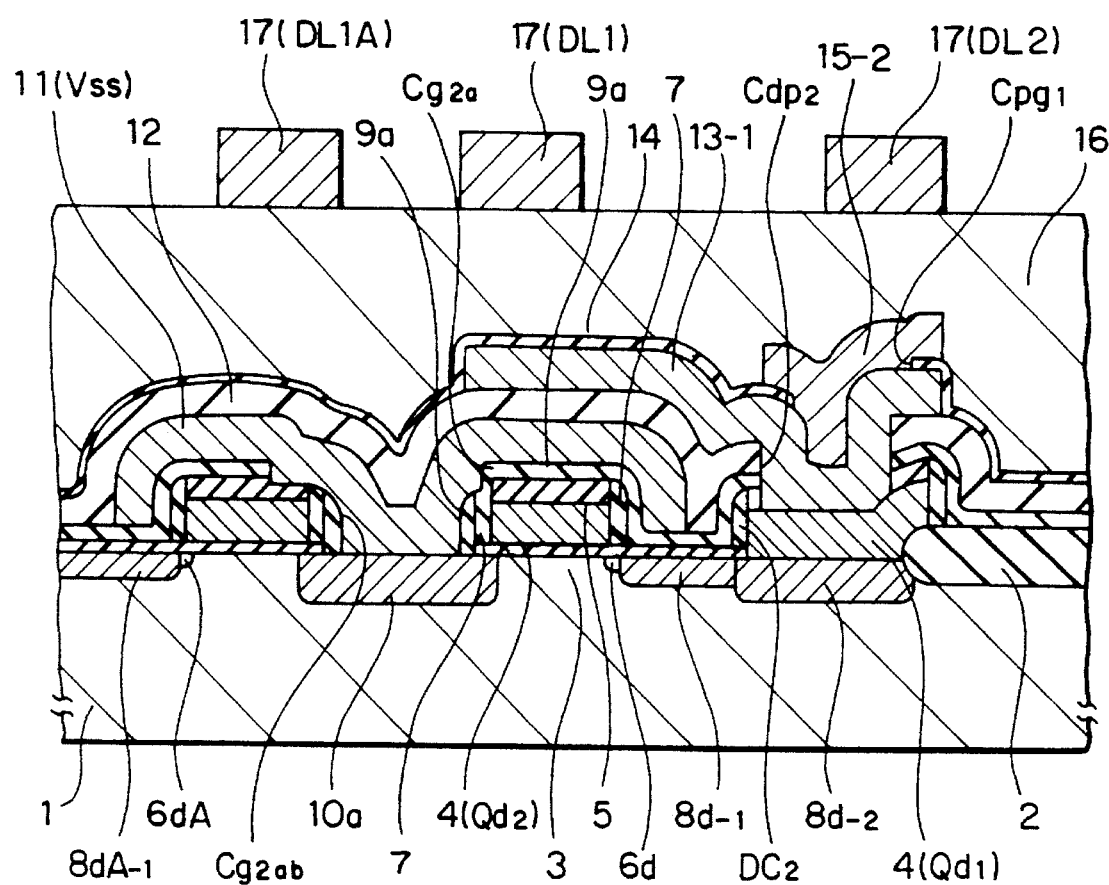
FIG. 4 is a section showing the first embodiment of the SRAM according to the invention.
Figure 5:
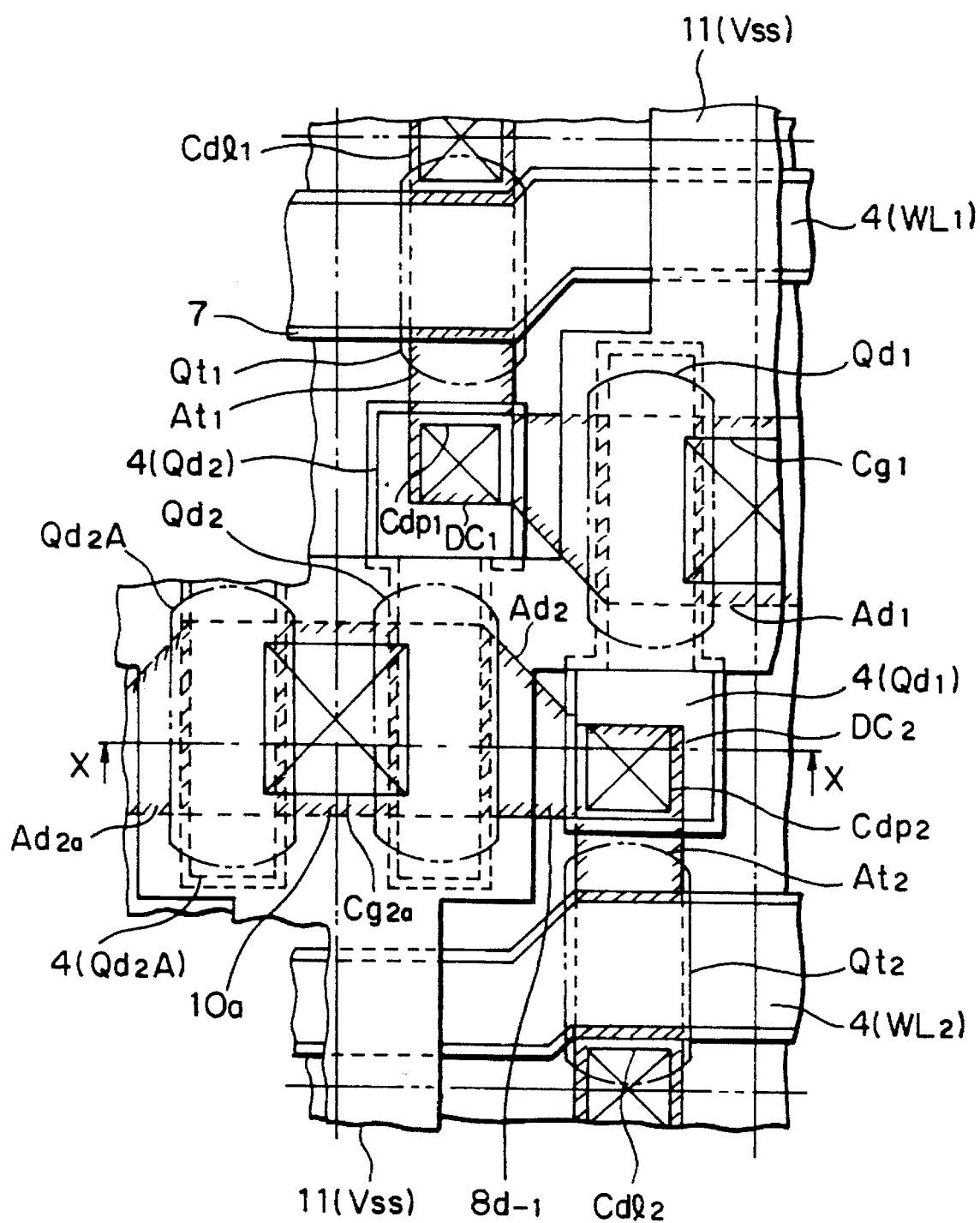
FIG. 5 is an explanatory section to be used for explaining the first embodiment of the SRAM.
Figure 6:
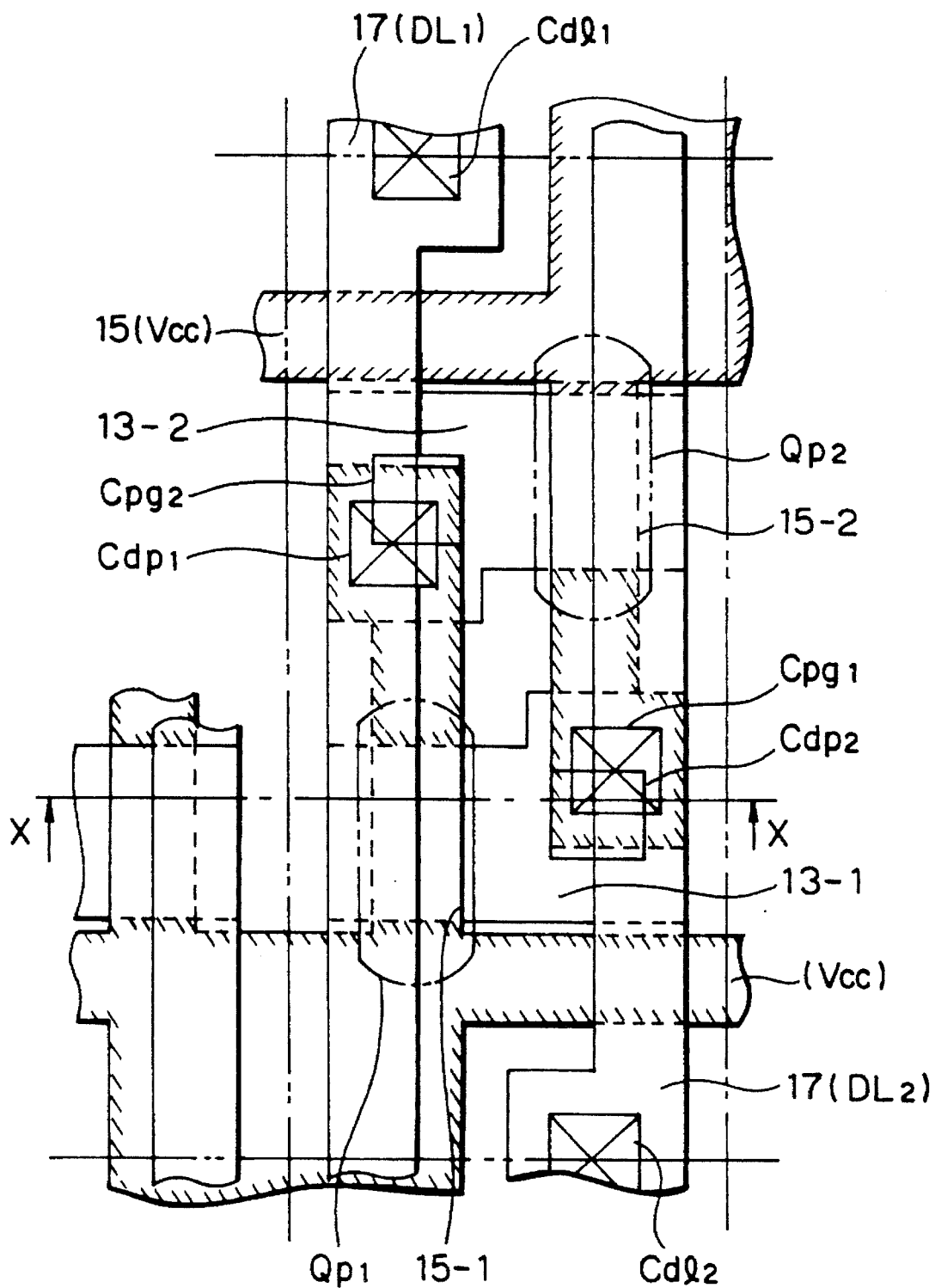
FIG. 6 is an explanatory section to be used for explaining the first embodiment of the SRAM.

FIG. 4 shows a section of the first embodiment of a SRAM according to the present invention. FIGS. 5 and 6 are plan views respectively showing driver transistors, switching transistors and load elements (MOSFET's). It should be noted that FIGS. 5 and 6 show the SRAM cell in divided form for the purpose of illustration, and which unitary show the overall construction of the first embodiment of SRAM cell as overlaid with overlapping common elements, i.e. contact holes Cdp1 and Cdp2. FIG. 4 is an enlarged section corresponding to a section taken along lines X—X in FIGS. 5 and 6. It should be noted that, in FIGS. 5 and 6, the boundary between the memory cells is shown by two-dotted lines.

Referring to FIGS. 4, 5, 6 and 1, the first embodiment of a semiconductor memory device includes two inverters constituted of driver transistors Qd1 and Qd2 and load elements Qp1 and Qp2. The semiconductor memory device has memory cells, each having a flip-flop connecting input end and output end of one of the inverters to output end and input end of the other inverter. Exemplifying with the driver transistor Qd2 among driver transistors Qd1 and Qd2, the driver transistor Qd2 has a gate electrode 4(Qd2) selectively formed on the surface of the P-type substrate 1 via the gate oxide layer 3, an insulative spacer 7 provided at the side surface of the gate electrode 4(Qd2), an interlayer insulation layer 9a covering the gate electrode provided with the spacer 7, an N-type low concentration drain region 6d and an N-type high concentration drain region 8d-1 provided on the surface portion of the silicon substrate in self-alignment with the gate electrode 4(Qd2) and the insulative spacer 7, a contact hole Cg2a having a boundary at the portion of the interlayer insulation layer 9a interfacing with the side surface of the insulative spacer 7 and extending between the drain regions (6d and 8d-1) and the gate electrode 4(Qd2) to reach the silicon substrate region at the opposite side, an N-type source region 10a provided on the surface of the silicon substrate in self-alignment with the bottom portion Cg2ab of the contact hole Cg2a, and a grounding wiring layer 11 (Vss) connected to the N-type source region 10a via the contact hole Cg2a.

While the drawing shows one SRAM cell and a part of the driver transistor Qd2 of the adjacent SRAM cell, in practice, a plurality of SRAM's having symmetric structure to that illustrated are arranged to form an array. In such case, two adjacent SRAM's are formed in symmetric configuration (mirror symmetric configuration) with respect to a plane extending along the boundary therebetween.

Figure 7A:
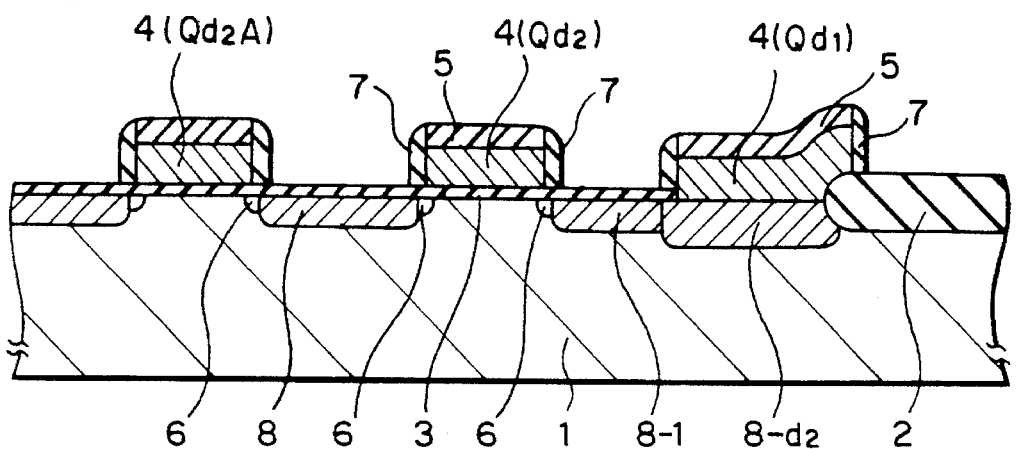
FIGS. 7A to 7C are sections showing the process steps in fabrication of the first embodiment of the SRAM.
Figure 7B:
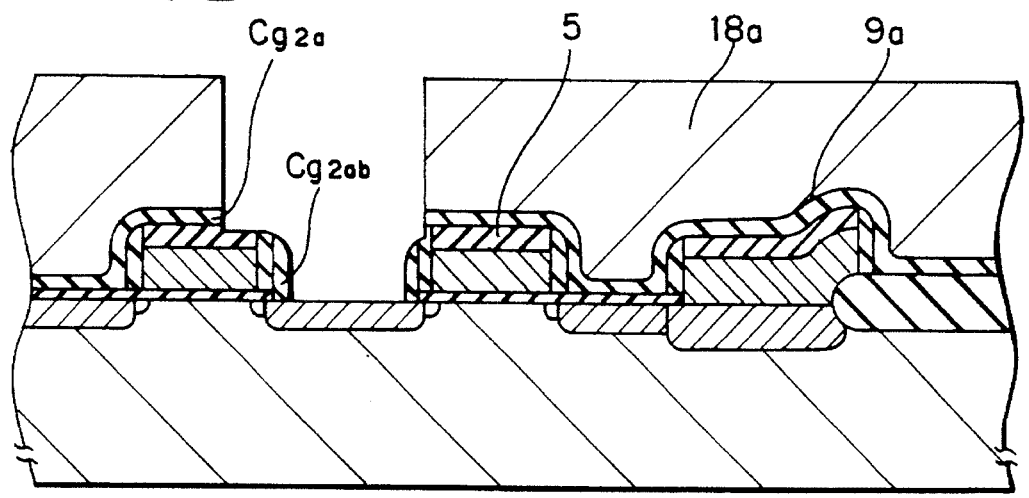
Figure 7C:
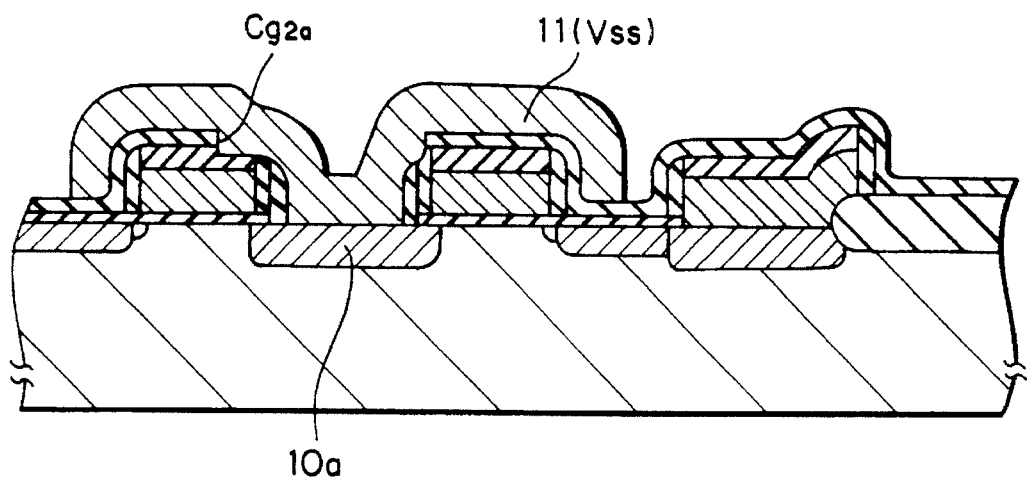

Next, fabrication process of the shown embodiment of the SRAM will be discussed. FIGS. 7A to 7C show the process steps in fabrication process of the preferred embodiment of SRAM.

At first, as shown in FIGS. 5 and 7A, a field oxide layer 2 having a thickness of 300 to 600 nm is formed on the surface of the P-type silicon substrate 1 for isolation of the elements by way of selective oxidation to define regions to form elements (switching transistor forming regions At1 and At2, driver transistor forming region Ad1 and Ad2). Also, on the element forming region, 10 to 20 nm of gate oxide layer 3 is formed.

Next, a buried contact holes DC1 and DC2 are formed. Subsequently, N-type doped polycrystalline silicon layer 4 and 100 to 300 nm thick silicon oxide layer 5 are deposited to form the gate electrode 4(Qd2) through patterning. Subsequently, using the field oxide layer 2 and the gate electrode 4(Qd2) and so forth as mask, ion implantation of phosphorous is performed at an energy of 20 to 60 keV and at a dose amount $1\times10^{13}$ to $3\times10^{13}$ cm$^{-2}$ to form N-type low concentration diffusion layer 6 of the LDD-structure MOSFET.

Subsequently, by depositing silicon oxide layer in a thickness of 100 to 300 nm and performing etching back, the insulative spacer 7 is formed on the side surface of the gate electrode 4(Qd2). Thereafter, ion implantation of arsenic is performed at an energy of 30 to 70 keV and at a dose amount of $1\times10^{15}$ to $1\times10^{16}$ cm$^{-2}$ to form N-type high concentration diffusion layers 8 and 8-1. It should be noted that the reference numeral 8-d represents N-type high concentration diffusion layer. Thus, the symmetric LDD structure MOS transistors Qt1, Qt2, Qd1 and Qd2 are completed.

Next, as shown in FIG. 7B, the silicon oxide layer as the interlayer insulation layer 9a is deposited over the entire surface in a thickness of 100 to 200 nm. Subsequently, using the photoresist layer 18a as a mask, an isotropic etching for the silicon oxide layer 9a is performed to form the contact hole Cg2a. Here, since the silicon oxide layer 5 is present above the gate electrodes 4(Qd2) and 4(Qd2A), the gate electrodes 4(Qd2) and 4(Qd2A) may not be exposed unless excessive over-etching is performed. Also, distances between the bottom portion Cg2ab of the contact hole Cg2a and the gate electrodes 4(Qd2) and 4(Qd2A) are determined by the width of the insulative spacer 7 and the thickness of the interlayer insulation layer formed on the side surface of the insulative spacer, the contact hole Cg2a may be formed uniformly without causing offset due to mask alignment.

Next, as shown in FIG. 7C, on the substrate surface exposed to the contact hole, ion implantation of phosphorous is performed at an energy of 30 to 60 keV and at a dose amount of $1\times10^{15}$ to $1\times10^{16}$ cm$^{-2}$. Subsequently, heat treatment is performed at 700 to 900° to form the source region 10a. Since the source region 10a (N-type high concentration diffusion layer) is propagated to extend immediately below the end of the gate electrodes 4(Qd2) and 4(Qd2A), the N-type low concentration diffusion layer 6 of FIG. 7A is disappeared. In this formation of the source region 10a, by performing ion implantation of phosphorous by rotational oblique implantation, necessity of heat treatment can be reduced. Thus, asymmetric source/drain structure of the driver transistor can be obtained.

On the other hand, the source region 10a is formed by impurity implantation through the contact hole Cg2a provided in self-alignment of the bottom portion Cg2ab to the gate electrodes 4(Qd2) and 4(Qd2A), extra lithographic process becomes unnecessary. Furthermore, since the distance between the bottom portion Cg2ab of the contact hole and the gate electrodes 4(Qd2) and 4(Qd2A) can be uniform without causing offset due to mask alignment, the resistance in the diffusion layer of the source region may have smaller fluctuation between the driver transistors. Thereafter, the grounding wiring layer 11 (Vcc) is formed by a tungsten silicide layer 11.

Subsequently, as shown in FIGS. 4 and 6, the interlayer insulation layer 12 is deposited to form contact holes Cdp1 and Cdp2 in the buried contact portion. Then, N-type doped polycrystalline silicon layer is deposited and patterned to form a gate electrode 13-1 of a TFT Qp1 and a gate electrode 13-2 of a TFT Qp2.

Then, TFT's Qp1 and Qp2 and a power source wiring 15 (Vcc) are formed by forming TFT gate oxide layer 14, providing contact holes Cpg1 and Cpg2, depositing polycrystalline silicon layer 15 and performing patterning to effect doping for P-type across channel portions 15-1 and 15-2 immediately above the gate electrodes 13-1 and 13-2 of the TFT's Qp1 and Qp2. Next, a data line 17 (DL1) is formed by depositing BPSG layer 16 and providing contact holes Cd11 and Cd12.

In the shown embodiment, the source region 10a of the driver transistor comprises N-type high concentration diffusion later and has no low concentration diffusion layer and offset region. Therefore, parasitic resistance is reduced to permit increasing of the on current without increasing the size of the transistor and stabilize the cell operation. While it is variable depending upon the width and concentration of the conventional N-type low concentration source region 6, the increasing magnitude of the on current may be approximately 0% to 40%.

Also, since the source region 10a is formed in self-alignment with respect to the bottom portion Cg2ab of the contact hole Cg2a and the gate electrode 4(Qd2), imbalance of the resistances in the diffusion layers in respective driver transistors in the cell can be reduced. By this, balance of the flip-flop forming the SRAM cell can be maintained for improving stability of the cell operation. This is effective for down-sizing of the cell.

Figure 8:
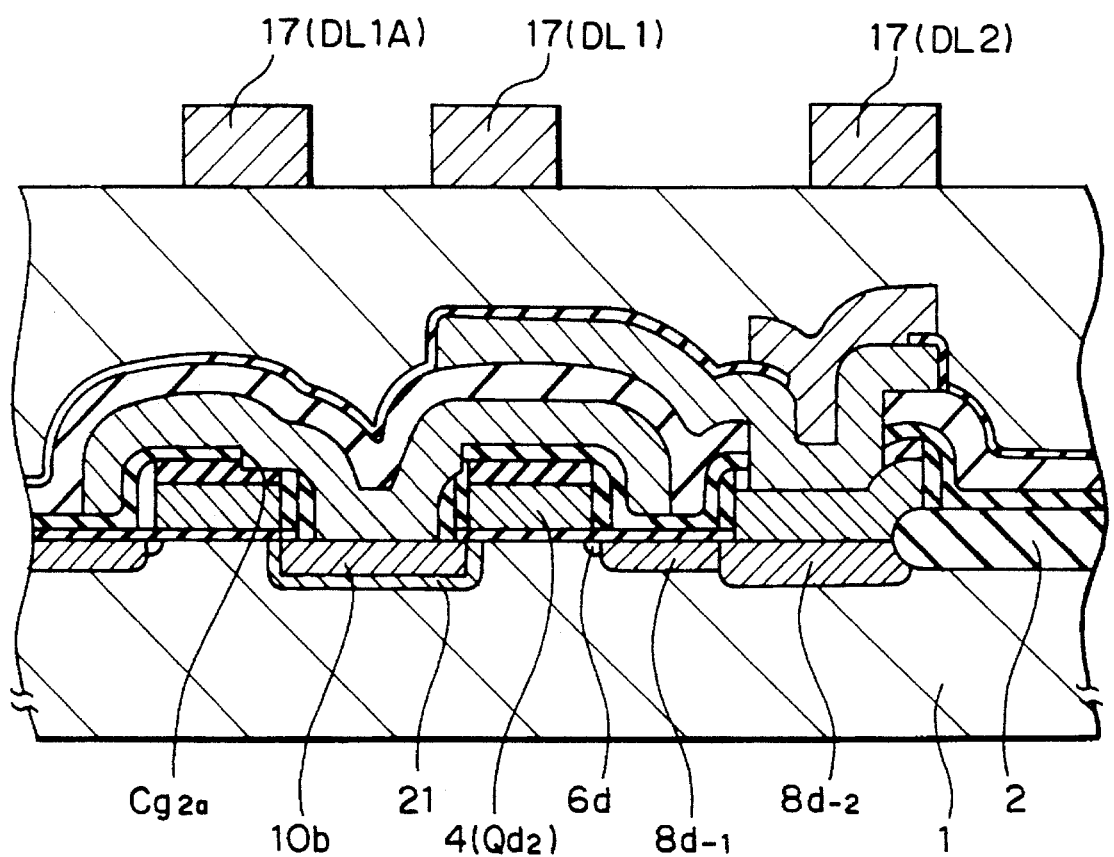
FIG. 8 is a section showing the second embodiment of the SRAM according to the invention.

Next, discussion will be given for the second embodiment of the semiconductor memory device according to the present invention. FIG. 8 is a section of the second embodiment of the semiconductor memory device of the present invention.

The fabrication process of the second embodiment is the same as that for the first embodiment up to the step of formation of the contact hole Cg2a (FIG. 7B).

After formation of contact hole Cg2a, an ion implantation is performed for the substrate surface exposed within the contact hole Cg2a at an energy of 40 to 80 keV and at a dose amount of $1\times10^{12}$ to $1\times10^{13}$ cm$^{-2}$ by rotational oblique implantation of boron. Subsequently, ion implantation of phosphorous is performed at an energy of 30 to 60 keV and at a dose amount of $1\times10^{15}$ to $1\times10^{16}$ cm$^{-2}$. Thereafter, heat treatment at 700 to 900° C. is performed to form the N-type high concentration source region 10b and P-type diffusion region 21. The side surface and the bottom surface of the N-type high concentration source region 10b is surrounded by the P-type diffusion region.

In the second embodiment, since the P-type diffusion region is formed outside of the source region 10b (N-type high concentration diffusion region), it is possible to restrict the depletion region of the drain spread to the source region. This is advantageous for shortening of channel of the driver transistor. Also, similar to the first embodiment, it does not require extra lithographic process. Furthermore, the above-mentioned effect with the diffusion layer resistance of the source region and the P-type diffusion region 21 can be realized uniformly in driver transistors without substantial fluctuation therebetween.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A semiconductor memory device including memory cells, each memory cell having a flip-flop circuit including two inverters, each inverter having a driver transistor, a load element, an input end and an output end, the input end and output end of one of the inverters being connected to the output end and input end of the other inverter, respectively, wherein the driver transistor comprises:

a gate insulation layer and a gate electrode selectively formed on the surface of a first conductive type semiconductor substrate;

an insulative spacer provided on the side surface of said gate electrode;

an interlayer insulation layer covering said insulative spacer and said gate electrode;

a second conductive type low concentration drain region and a second conductive type high concentration drain region formed on the surface of said semiconductor substrate with self-aligning with said gate electrode and said insulative spacer respectively;

a contact hole having a boundary at a portion of said interlayer insulation layer fitted with the side surface of said insulative spacer and having an interval of said drain region and said gate electrode to reach a region on said semiconductor substrate;

a second conductive type source region provided on said semiconductor substrate in self-alignment with the bottom portion of said contact hole; and a grounding wiring connected to said second conductive type source region via said contact hole.

2. A semiconductor memory device as set forth in claim 1, wherein said load element is a first conductive type MOS type TFT.

* * * * *